United States Patent
Lee et al.

(10) Patent No.: US 6,908,977 B2
(45) Date of Patent: Jun. 21, 2005

(54) SILOXANE-BASED RESIN AND METHOD OF FORMING AN INSULATING FILM BETWEEN INTERCONNECT LAYERS OF A SEMICONDUCTOR DEVICE USING THE SAME

(75) Inventors: Jin Gyu Lee, Seoul (KR); Yi Yeol Lyu, Daejeon-Shi (KR); Ji Hun Rhee, Gyeonggi-Do (KR)

(73) Assignee: Samsung Electronics Co., Ltd., Suwon-shi (KR)

( * ) Notice: Subject to any disclaimer, the term of this patent is extended or adjusted under 35 U.S.C. 154(b) by 57 days.

(21) Appl. No.: 10/685,454

(22) Filed: Oct. 16, 2003

(65) Prior Publication Data

US 2004/0096398 A1 May 20, 2004

(30) Foreign Application Priority Data

Oct. 31, 2002 (KR) ................. 10-2002-0066819

(51) Int. Cl.[7] .......................... C08G 77/00; H01L 21/31
(52) U.S. Cl. ......................................... 528/10; 438/763
(58) Field of Search .................. 528/31, 20, 4–10; 523/427; 430/302, 270.1, 108.1, 49, 46; 385/143, 123; 438/763, 761, 758

(56) References Cited

U.S. PATENT DOCUMENTS

| | | | |
|---|---|---|---|
| 3,615,272 A | 10/1971 | Collins et al. | |
| 4,399,266 A | 8/1983 | Matsumura et al. | |
| 4,999,397 A | 3/1991 | Weiss et al. | |
| 5,010,159 A | 4/1991 | Bank et al. | |
| 5,853,808 A | 12/1998 | Arkles et al. | |
| 6,000,339 A | 12/1999 | Matsuzawa | |
| 6,232,424 B1 | 5/2001 | Zhong et al. | |

FOREIGN PATENT DOCUMENTS

KR    2001-0015883    2/2001

*Primary Examiner*—Wael Fahmy
*Assistant Examiner*—Monica D. Harrison
(74) *Attorney, Agent, or Firm*—Birch, Stewart, Kolasch & Birch, LLP

(57) ABSTRACT

Disclosed herein is a siloxane-based resin prepared by hydrolyzing and polycondensing a cyclic siloxane compound, a silane compound having three hydrolysable functional groups and a silane compound having three hydrolysable functional groups and one heat-labile functional group, in an organic solvent in the presence of a catalyst and water. Also, disclosed herein is a method of forming an insulating film between interconnect layers of a semiconductor device using the siloxane-based resin thus prepared, whereby an insulating film having low dielectric constant as well as excellent mechanical properties can be obtained.

5 Claims, No Drawings

SILOXANE-BASED RESIN AND METHOD OF FORMING AN INSULATING FILM BETWEEN INTERCONNECT LAYERS OF A SEMICONDUCTOR DEVICE USING THE SAME

This nonprovisional application claim priority under 35 U.S.C § 119(a) on patent application No. 2002-66819 filed in KOREA on Oct. 31, 2002, which is herein incorporated by reference.

FIELD OF THE INVENTION

The present invention relates to a siloxane-based resin and a method of forming an insulating film between interconnect layers of a semiconductor device using the same. More specifically, the present invention relates to a siloxane-based resin prepared by hydrolyzing and polycondensing a) cyclic siloxane compound, b) silane compound having three hydrolysable functional groups and c) silane compound having three hydrolysable functional groups and a functional group that can be removed by heat(hereinafter, referred as heat-labile functional group) in an organic solvent in the presence of a catalyst and water. The present invention also relates to a method of forming an insulating film between interconnect layers of a semiconductor device using the siloxane-based resin thus prepared, whereby an insulating film having low dielectric constant as well as excellent mechanical properties can be obtained.

BACKGROUND OF THE INVENTION

Under the circumstance where the circuit density of multilevel integrated circuit devices is continuously increasing, the performance of electrical device depends on the speed of electric wire and for reducing resistance and capacity in the electric wire, accumulative capacity of inter-layer insulating films needs to be lowered.

In this regard, U.S. Pat. Nos. 3,615,272; 4,399,266; and 4,999,397 disclose the formation of insulating films by SOD(spin on deposition) method using polysilsesquioxanes having dielectric constant of 2.5–3.1 as well as good planarization properties, instead of using Conventional $SiO_2$ layer that has dielectric constant of 4.0 and is formed by CVD(chemical vapor deposition) method using.

Polysilsesquioxanes as well as preparation methods thereof are well known in the art. For example, U.S. Pat. No. 3,615,272 discloses a method of preparing a completely condensed, soluble hydrogensilsesquioxane resin, which comprises the steps of condensing trichlorosilanes in a sulfuric acid medium and washing the resulting resin with water or aqueous sulfuric acid. Also, U.S. Pat. No. 5,010,159 discloses a method of synthesizing a soluble condensed hydridosilicon resin, which comprises the steps of hydrolyzing hydridosilanes in an arylsulfuric acid hydrate-containing hydrolysis medium and contacting the resulting resin with a neutralizing agent. U.S. Pat. No. 6,232,424 describes a highly soluble silicon resin composition having excellent solution stability, which was prepared by hydrolyzing and polycondensing tetraalkoxysilane, organosilane and organotrialkoxysilane monomers in the presence of water and a catalyst. U.S. Pat. No. 6,000,339 describes that a silica-based compound is useful for improving the resistance to oxygen plasma and physical properties as well as thickness of a coating film, which can be obtained through reacting a monomer selected from the group consisting of alkoxysilane, fluorine-containing alkoxysilane and alkylalkoxysilane with a titanium- or zirconium-alkoxide compound in the presence of water and a catalyst. U.S. Pat. No. 5,853,808 describes that silsesquioxane polymers useful for forming $SiO_2$-rich ceramic coating can be obtained from hydrolysis and polycondensation of organosilanes having a β-substituted alkyl group.

However, any of these prior polysilsesquioxane resins do not have a dielectric constant that is low enough to meet the current requirements for an interlayer insulating film in the field of highly integrated semiconductor devices. Additionally, there has been demand for an interlayer insulating film that was improved in other physical properties including mechanical properties, thermal stability, crack-resistance, and so on.

SUMMARY OF THE INVENTION

The present invention features the formation of an insulating film between interconnect layers of a semiconductor device using a novel siloxane-based resin having lowered dielectric constant, wherein the insulating film exhibits low dielectric constant and excellent mechanical properties.

In accordance with one aspect of the present invention, there is provided a siloxane-based resin prepared by hydrolyzing and polycondensing monomers (a), (b) and (c) in an organic solvent in the presence of a catalyst and water, wherein monomer (a) is a cyclic siloxane compound of formula (1), monomer (b) is a silane compound of formula (2), and monomer (c) is a silane compound of formula (3):

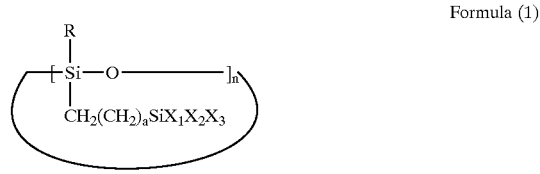

Formula (1)

[in which,
R is hydrogen atom, $C_{1-3}$ alkyl group, $C_{3-10}$ cycloalkyl group or $C_{6-15}$ aryl group;
each of $X_1$, $X_2$ and $X_3$, independently, is hydrogen atom, $C_{1-3}$ alkyl group, $C_{1-10}$ alkoxy group or halogen group, provided that at least one of them is $C_{1-10}$ alkoxy group or halogen group;
m is an integer from 1 to 10; and
n is an integer from 3 to 8];

Formula (2)

[in which,
R' is hydrogen atom, $C_{1-3}$ alkyl group, $C_{3-10}$ cycloalkyl group or $C_{6-15}$ aryl group; and
each of $X_1$, $X_2$ and $X_3$, independently, is $C_{1-10}$ alkoxy group or halogen group]; and

Formula (3)

[in which,
R" is $C_{1-3}$ alkyl or aryl group including fluoro, phenyl or cyano substituent; and
each of $X_1$, $X_2$ and $X_3$, independently, is $C_{1-10}$ alkoxy group or halogen group].

In accordance with another aspect of the present invention, there is provided a method of forming an insulating film between interconnect layers of a semiconductor device, the method comprising the steps of: providing a coating composition by dissolving the siloxane-based resin in an organic solvent, optionally with one or more pore-forming agent(s) (or porogen); coating a silicon wafer with the composition to form a coating film; and curing the coating film by heat.

All of the above features and other features of the present invention will be successfully achieved from the present invention described in the following.

DETAILED DESCRIPTION OF THE INVENTION

A siloxane-based resin of the present invention is 3-membered copolymer, prepared by hydrolyzing and polycondensing three different monomers of a) a cyclic siloxane compound, b) a silane compound having three hydrolysable functional groups and c) a silane compound having three hydrolysable functional groups and one heat-labile functional group.

A cyclic siloxane monomer (hereinafter, referred to as monomer (a)) used in the present invention is a siloxane compound that can be represented by formula (1), wherein two silicon atoms are linked to each other via an oxygen atom to form a cyclic structure, and the terminal of each branch comprises at least one hydrolysable group:

Formula 1

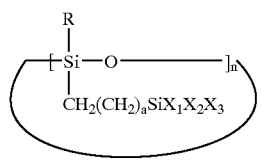

[which,

R is hydrogen atom, $C_{1-3}$ alkyl group, $C_{3-10}$ cycloalkyl group or $C_{6-15}$ aryl group;

each of $X_1$, $X_2$ and $X_3$, independently, is hydrogen atom, $C_{1-3}$ alkyl group, $C_{1-10}$ alkoxy group or halogen group, provided that at least one of them is $C_{1-10}$ alkoxy group or halogen group;

m is an integer from 1 to 10; and n is an integer from 3 to 8].

In the preferred embodiment of the present invention, the Monomer (a) can be prepared by hydrosililation of a vinyl group substituted at Si, using a suitable metal catalyst.

On the other hand, two different silane monomers used in the present invention are (i) a silane compound (hereinafter, referred to as monomer (b)) having three hydrolysable functional groups and (ii) a silane compound (hereinafter, referred to as monomer (c)) having not only three hydrolysable functional groups but also one heat-labile functional group. Monomers (b) and (c) can be represented by the following formulas (2) and (3), respectively:

 Formula (2)

[in which,

R' is hydrogen atom, $C_{1-3}$ alkyl group, $C_{3-10}$ cycloalkyl group or $C_{6-15}$ aryl group; and each of $X_1$, $X_2$ and $X_3$, independently, is $C_{1-10}$ alkoxy group or halogen group]; and

 Formula (3)

[in which,

R" is $C_{1-3}$ alkyl or aryl group including fluoro, phenyl or cyano substituent; and each of $X_1$, $X_2$ and $X_3$, independently, is $C_{1-10}$ alkoxy group or halogen group].

Examples for the silane compound of formula (2) include methyl triethoxy silane, methyl trimethoxy silane, methyl tri-n-propoxy silane, phenyl trimethoxy silane, phenyl triethoxy silane, phenyl trichloro silane, phenyl trifluoro silane, methyl trichloro silane, methyl tribromo silane, methyl trifluoro silane, triethoxy silane, trimethoxy silane, trichloro silane and trifluoro silane. Examples for the silane compound of formula (3) include 3,3,3-trifluoropropyl trimethoxy silane, phenethyl trimethoxy silane and cyanoethyl trimethoxy silane.

The siloxane-based resin of the present invention can be obtained as a copolymeric product from hydrolysis and polycondensation of monomers (a), (b) and (c) in an organic solvent in the presence of a catalyst and water.

In the preparation of the 3-membered siloxane-based resin of the present invention, the monomers (a) to (c), respectively, are introduced in the amount of at least 1 mol % and, preferably in terms of mechanical properties of the resin, the mole ratio of monomer (a): monomer (b):monomer (c) is maintained in the range of 0.5–5:5–20:0.5–5.

Meanwhile, as the organic solvent used in the preparation of the inventive siloxane-based resin, aromatic hydrocarbon solvent, aliphatic hydrocarbon solvent, ketone-based solvent, ether-based solvent, acetate-based solvent, alcohol-based solvent, silicon-based solvent, and mixtures thereof are preferred.

Also, the catalyst used in the present invention, is not limited to, but is preferably one or more compound selected from the group consisting of hydrochloric acid, nitric acid, benzene sulfonic acid, oxalic acid, formic acid, potassium hydroxide, sodium hydroxide, triethylamine, sodium bicarbonate and pyridine.

In the hydrolysis and polycondensation reactions according to the present invention, $10^{-8}$–$10^{-1}$ mol of the catalyst is preferably added to 1 mol of the total monomer(monomer (a)+monomer (b)+monomer (c)).

Further, according to the present invention, water is added in an amount of 0.1–10 mol based on 1 mol of the total monomer(monomer (a)+monomer (b)+monomer (c)). In that case, the resulting mole ratio of water to monomer ranges between 0.1:1–10:1.

In the present invention, the hydrolysis and polycondensation reactions are carried out at a temperature of 0–200° C., preferably 50–110° C., for 0.1–100 hrs, preferably 3–48 hrs.

The siloxane-based resin thus prepared has an weight-average molecular weight of 3,000–500,000, preferably 3,000–100,000. Preferably, Si—OR content in the whole terminal groups represented by Si—OR and/or Si—R amounts to at least 10 mol %, wherein R is hydrogen atom, $C_{1-3}$ alkyl group, $C_{3-10}$ cycloalkyl group or $C_{6-15}$ aryl group. This inventive siloxane-based resin can be used as a matrix polymer for an interlayer insulating film of a semiconductor device.

Below is provided detailed description of how to form an insulating film using the inventive siloxane-based resin.

According to the present invention, a method of forming an insulating film by the use of the inventive siloxane-based resin comprises the steps of: dissolving the siloxane-based resin in an organic solvent to provide a coating composition; coating a silicon wafer with the coating composition to form a coating film; and curing the coating film by heat.

In the present invention, the coating composition can further comprise a porogen. As used herein, by "porogen" is meant any pore-forming agents. Non-limiting examples of the porogen useful for the present invention include cyclodextrin and its derivatives as described in Korean Patent Appln. No. 2001-15883. They have heat-labile three dimensional structure as depicted in the following formula (4) so that they can form nano-pores of 50 Å or less evenly throughout a matrix:

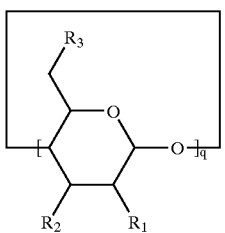

Formula (4)

[in which, q is an integer of 6–12;

each of $R_1$, $R_2$ and $R_3$, independently, is halogen atom, $C_{0-10}$ amino or azido group, $C_{3-20}$ imidazole or pyridine group, $C_{1-10}$ cyano group, $C_{2-10}$ carbonate group, $C_{1-10}$ carbamate group or a functional group represented by —$OR_4$ (wherein $R_4$ is hydrogen atom, $C_{2-30}$ acyl group, $C_{1-20}$ alkyl group, $C_{3-10}$ alkene group, $C_{3-20}$ alkyne group, $C_{7-20}$ tosyl group, $C_{1-10}$ mesyl group, $C_{0-10}$ phosphorus group, $C_{3-10}$ cycloalkyl group, $C_{6-30}$ aryl group, $C_{1-20}$ hydroxyalkyl group, carboxy group, $C_{1-20}$ carboxyalkyl group, glucosyl group, maltosyl group or Si compound represented by $Sir_1r_2r_3$, wherein each of $r_1$, $r_2$ and $r_3$, independently, is $C_{1-5}$ alkyl, $C_{1-5}$ alkoxy or $C_{6-20}$ aryl group)].

Use of a porogen combined with the inventive siloxane-based resin leads to even lower dielectric constant of the final insulating film so the formation of thin film having low dielectric constant of 2.5 or lower can be facilitated and the film thus prepared can be used as an interlayer insulating film of a semiconductor device.

Among the cyclodextrin derivatives, β-cyclodextrin derivatives of the following formula (5) are particularly preferred, which have a restricted ternary structure of 13–17 Å in dimensions:

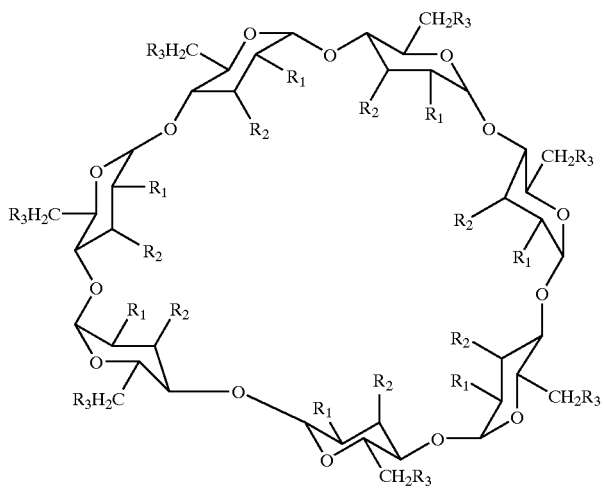

Formula (5)

[in which, $R_1$, $R_2$ and $R_3$ are as defined in the above formula (4)].

Non-limiting examples of the porogen useful in the present invention include hexakis(2,3,6-tri-O-acetyl)-α-cyclodextrin, heptakis(2,3,6-tri-O-acetyl)-β-cyclodextrin, octakis(2,3,6-tri-O-acetyl)-γ-cyclodextrin, hexakis(2,3,6-tri-O-methyl)-α-cyclodextrin, heptakis (2,3,6-tri-O-methyl)-β-cyclodextrin, hexakis(6-O-tosyl)-α-cyclodextrin, hexakis(6-amino-6-dioxy)-α-cyclodextrin, heptakis(6-amino-6-dioxy)-β-cyclodextrin, bis(6-azido-6-dioxy)-β-cyclodextrin, hexakis(2,3-O-acetyl-6-bromo-6-dioxy)-α-cyclodextrin, heptakis(2,3-O-acetyl-6-bromo-6-dioxy)-β-cyclodextrin, mono(2-O-phosphoryl)-α-cyclodextrin, mono(2-O-phosphoryl)-β-cyclodextrin, hexakis(6-dioxy-6-(1-imidazoyl))-β-cyclodextrin and mono(2,(3)-O-carboxymethyl))-α-cyclodextrin.

Organic solvents for dissolving the siloxane-based resin and/or the porogen to provide a coating composition, are not limited to, but preferably include aliphatic hydrocarbon solvents; aromatic hydrocarbon solvents such as anisole, mesitylene and xylene; ketone-based solvents such as methyl isobutyl ketone, 1-methyl-2-pyrrolidinone, cyclohexanone and acetone; ether-based solvents such as tetrahydrofuran and isopropyl ether; acetate-based solvents such as ethyl acetate, butyl acetate and propylene glycol methylether acetate; alcohol-based solvents such as isopropyl alcohol, butyl alcohol and octyl alcohol; amide-based solvents such as dimethylacetamide and dimethylformamide; silicon-based solvents; and mixtures thereof.

Organic solvents should be used in such a sufficient amount that the siloxane-based resin or a mixture of the siloxane-based resin and porogen can be applied to the substrate with easy. So, each concentration of the resin solution and porogen solution should be in the range of 0.1–80 wt %, preferably 5–40 wt % and the two solutions are preferably mixed together with a mixing ratio of the resin solution to the porogen solution falls between 100:1–1:99 (v/v).

In the present invention, the coating composition (the siloxane-based resin solution, or the mixture of the siloxane-based resin solution and the porogen solution) can be applied to a substrate with various coating methods well known in the art. Non-limiting examples of the coating method useful in the present invention include spin-coating, dip-coating, spray-coating, flow-coating, and screen-printing, while spin-coating is most preferred. For spin coating, it is preferred that the spin rate is controlled between 1,000 and 5,000 rpm.

After the completion of the coating, the organic solvent is evaporated so that a dry coating film comprising the siloxane-based resin is formed on the substrate. The evaporation is carried out by simple air-drying. Alternatively, at the beginning of the following heat-curing step, the substrate is subjected to a vacuum condition or to mild heating at a temperature of 100° C. or lower for the evaporation.

Subsequently, the dry coating film is cured by heating the wafer for 1 to 150 minutes at a temperature of 150–600° C., preferably 200–500° C., so as to provide an insoluble, crack-free film. As used herein, by "crack-free film" is meant a film without any crack that can be observed with an optical microscope at a magnification of 1000×. As used herein, by "insoluble film" is meant a film that is substantially insoluble in any solvent described as being useful for dissolving the inventive siloxane-based resin.

The coating film thus formed was found to have a dielectric constant below 3.0, preferably between 1.5 and 2.7, and so it is very useful as an insulating film between interconnect layers of a semiconductor device.

The present invention can be more clearly understood with referring to the following examples. It should be understood that the following examples are not intended to restrict the scope of the present invention in any manner.

PRODUCTION EXAMPLE 1

Synthesis of Cyclic Siloxane Monomer

To a flask were added 10.0 g (29.014 mmol) of 2,4,6,8-tetramethyl-2,4,6,8-tetravinylcyclotetrasiloxane and 0.164 g of platinum(O)-1,3-divinyl-1,1,3,3-tetramethyldisiloxane complex(solution in xylene), and then diluted with 300 ml of diethylether. Next, the flask was cooled to −78° C., 17.29 g(127.66 mmol) of trichlorosilane was slowly added thereto, and it was slowly warmed to room temperature. The reaction was continued at room temperature for 20 hrs, and volatile materials were removed from the reaction mixture under a reduced pressure of about 0.1 Torr. To the reaction mixture was added 100 ml of pentane and stirred for 1 hr, followed by filtering through celite. From the resulting filtrate was evaporated pentane under a reduced pressure of about 0.1 Torr to afford a liquid compound represented by the following formula:

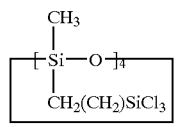

10.0 g(11.28 mmol) of the liquid compound was diluted with 500 ml of tetrahydrofuran, and 13.83 g(136.71 mmol) of triethylamine was added thereto. Thereafter, the mixture was cooled to −78° C., 4.38 g(136.71 mmol) of methyl alcohol was slowly added thereto, and it was slowly warmed to room temperature. The reaction was continued at room temperature for 16 hrs and filtered through celite, and then volatile materials were evaporated from the resulting filtrate under a reduced pressure of about 0.1 Torr. Subsequently, 100 ml of pentane was added to the remaining filtrate and stirred for 1 hr, followed by filtering through celite to afford a clear colorless solution. Finally, pentane was evaporated from this solution under a reduced pressure of about 0.1 Torr to afford a cyclic siloxane monomer represented by the following formula:

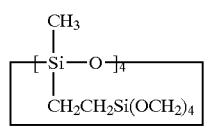

The results obtained from NMR analysis of this monomer dissolved in $CDCl_3$ are as follows:

$^1$H-NMR(300 MHz): δ 0.09(s, 12H, 4-$CH_3$), 0.52–0.64 (m, 16H, 4-$CH_2CH_2$—), 3.58(s, 36H, 4-[$OCH_3$]$_3$)

EXAMPLE 1

Synthesis of Siloxane-Based Resins (A)–(C)

Cyclic siloxane monomer obtained from the above Production Example 1 as monomer (a), methyltrimethoxysilane (MTMS) as monomer (b), and 3,3,3-trifluorpropyl trimethoxysilane as monomer (c) were quantified respectively according to Table 1 below and introduced to a flask, followed by dilution with 50 ml of tetrahydrofuran. Subsequently, after cooling the flask down to −78° C., 20.16 ml of deionized water and 4.03 ml of 10$^{-4}$M HCl were slowly added thereto. Then, the flask was warmed to 70° C., at which temperature the flask was left for 24 hrs so that the reaction could continue. At the completion of the reaction, the reaction mixture was transferred to a separatory funnel, followed by addition of 150 ml of diethylether. After washing with 3×30 ml of deionized water, volatile materials were evaporated from the remaining solution to afford white powdery polymers. The powder was dissolved in a small amount of acetone, and filtered through a 0.2 μm syringe filter so as to remove impurities to provide a clear filtrate, to which was then slowly added deionized water. The resulting white powdery material was separated from the liquid phase(mixed solution of acetone and water), and then dried at a temperature of 0–5° C. under a reduced pressure of about 0.1 Torr to afford a fractionated siloxane-based resin.

TABLE 1

| | Monomer (g) | | | | | |
|---|---|---|---|---|---|---|
| Resin | Monomer (a) | Monomer (b) | Monomer (c) | Hcl (mol) | $H_2O$ (mol) | Yield (g) |
| (A) | 8 | 11.77 | 2.1 | 4.03 × 10$^{-4}$ | 1.12 | 6.8 |
| (B) | 8 | 11.77 | 4.2 | 4.32 × 10$^{-4}$ | 1.21 | 7.6 |
| (C) | 8 | 11.77 | 6.3 | 4.61 × 10$^{-4}$ | 1.28 | 9.4 |

EXAMPLE 2

Synthesis of Siloxane-Based Resins (D)–(F)

The procedure of Example 2 was conducted according to the same manner as in the above Example 1, except that cynoethyltrimethoxysilane was used as monomer (c).

TABLE 2

| | Monomer (g) | | | | | |
|---|---|---|---|---|---|---|
| Resin | Monomer (a) | Monomer (b) | Monomer (c) | Hcl (mol) | $H_2O$ (mol) | Yield (g) |
| (D) | 8 | 11.77 | 1.68 | 4.03 × 10$^{-4}$ | 1.12 | 6.0 |
| (E) | 8 | 11.77 | 3.36 | 4.03 × 10$^{-4}$ | 1.21 | 6.9 |
| (F) | 8 | 11.77 | 5.04 | 4.03 × 10$^{-4}$ | 1.28 | 8.4 |

EXAMPLE 3

Synthesis of Siloxane-Based Resins (G)–(I)

The procedure of Example 3 was conducted according to the same manner as in the above Example 1, except that phenethyltrimethoxysilane was used as monomer (c).

TABLE 3

| Resin | Monomer (g) | | | Hcl (mol) | H₂O (mol) | Yield (g) |
|---|---|---|---|---|---|---|
| | Monomer (a) | Monomer (b) | Monomer (c) | | | |
| (G) | 8 | 11.77 | 2.17 | $4.03 \times 10^{-4}$ | 1.12 | 5.5 |
| (H) | 8 | 11.77 | 4.34 | $4.03 \times 10^{-4}$ | 1.21 | 6.4 |
| (I) | 8 | 11.77 | 6.51 | $4.03 \times 10^{-4}$ | 1.28 | 8.0 |

EXAMPLE 4

Measurement of Thickness and Refractive Index of Resinous Film

The siloxane-based resins (A), (D), and (G), which had been obtained from the above Examples 1–3, and a porogen, heptakis(2,3,6-tri-O-methyl)-β-cyclodextrin, respectively, was dissolved in propylene glycol methyl ether acetate (PGMEA) to obtain 25 wt % solution. Each of the resin solution and the porogen solution were then mixed according to a volume ratio as set forth in Table 4 below. Each of the mixed solution was spin-coated onto a silicon wafer for 30 seconds with maintaining the spin rate of 3,000 rpm. In a nitrogen atmosphere, the coated wafers were subjected to sequential soft baking on a hot plate(1 min at 100° C. and another minute at 250° C.) so as to remove the organic solvent sufficiently. Thereafter, the temperature was elevated to 420° C. at a rate of 3° C./min under vacuum condition, at which temperature the coating films were allowed to cure for 1 hr to afford test pieces.

Each of the test pieces thus prepared was analyzed for film thickness and refractive index with the aid of an ellipsometer. The results are set forth in Table 4 below.

TABLE 4

| Resin | Resin solution:Porogen solution (v/v) | Thickness (Å) | Dielectric constant (k) | Refractive index |
|---|---|---|---|---|
| (A) | 100:0 | 5185 | 2.75 | 1.38 |
| | 90:10 | 5288 | 2.69 | 1.375 |
| | 80:20 | 4414 | 2.22 | 1.37 |
| | 70:30 | 4347 | 2.26 | 1.35 |
| (D) | 100:0 | 5100 | 2.70 | 1.37 |
| | 90:10 | 4920 | 2.65 | 1.36 |
| | 80:20 | 4620 | 2.40 | 1.35 |
| | 70:30 | 4374 | 2.01 | 1.33 |
| (G) | 100:0 | 5255 | 2.75 | 1.37 |
| | 90:10 | 4800 | 2.59 | 1.355 |
| | 70:30 | 4400 | 2.10 | 1.33 |

EXAMPLE 5

Measurement of Dielectric Constant of Resinous Film

P-type silicon wafers doped with boron were coated with a 3000 Å Silicon oxide film, followed by sequential deposition of a 100 Å titanium layer and a 2000 Å aluminum layer using a metal evaporator. On the surface of each of these wafer was formed a resinous film according to the same manner as in the above Example 4. Subsequently, a circular aluminum electrode(1 mm in diameter, 2000 Å in thickness) was deposited on the resinous film through a hard mask so as to provide a test piece having MIM(metal-insulator-metal) structure. Test pieces thus prepared were subjected to measurement of capacitance using PRECISION LCR METER(HP4284A) with Micromanipulator 6200 probe station. The measurement was accomplished at three different frequencies, 10 kHz, 100 kHz and 1000 kHz. Dielectric constant of each test film was calculated from the following equation, wherein "d" value was obtained by the use of an ellipsometer:

$$k = (C \times d)/(\epsilon_o \times A)$$

Note) k: dielectric ratio

C: capacitance $\epsilon_o$: dielectric constant in vacuum d: film thickness

A: contact area of the electrode

The calculated dielectric constants are set forth in Table 4 above.

EXAMPLE 6

Variation of Dielectric Constant of Resinous Film by Moisture Absorption

To examine the possible variation of dielectric constant of resinous film by moisture absorption, test pieces having MIM structure were prepared according to the same procedure as in the above Example 5. While preserving the test pieces in water, capacitance measurement was carried out as in the above Example 5 on day 0, 1, 2, 3 and 4. The calculated dielectric constants are set forth in Table 5.

TABLE 5

| Resin | Resin soln.:Porogen soln. (v/v) | Thickness (Å) | D.C.* (day 0) | D.C.* (day 1) | D.C.* (day 2) | D.C.* (day 3) | D.C.* (day 4) |
|---|---|---|---|---|---|---|---|
| (A) | 100:0 | 7603 | 2.74 | 2.77 | 2.74 | 2.72 | 2.7 |
| | 90:10 | 7367 | 2.53 | 2.52 | 2.51 | 2.49 | 2.48 |
| | 80:20 | 7207 | 2.34 | 2.34 | 2.32 | 2.35 | 2.34 |
| (B) | 100:0 | 7106 | 2.80 | 2.83 | 2.82 | 2.82 | 2.82 |
| | 90:10 | 8187 | 2.54 | 2.54 | 2.53 | 2.54 | 2.54 |
| | 80:20 | 6727 | 2.11 | 2.13 | 2.13 | 2.11 | 2.12 |

TABLE 5-continued

| Resin | Resin soln.:Porogen soln. (v/v) | Thickness (Å) | D.C.* (day 0) | D.C.* (day 1) | D.C.* (day 2) | D.C.* (day 3) | D.C.* (day 4) |
|---|---|---|---|---|---|---|---|
| (D) | 100:0 | 5100 | 2.70 | 2.71 | 2.72 | 2.73 | 2.72 |
|  | 90:10 | 4920 | 2.65 | 2.67 | 2.66 | 2.65 | 2.67 |
|  | 80:20 | 4620 | 2.40 | 2.42 | 2.41 | 2.43 | 2.41 |
| (G) | 100:0 | 5600 | 2.73 | 2.72 | 2.73 | 2.74 | 2.72 |
|  | 90:10 | 5425 | 2.61 | 2.62 | 2.63 | 2.64 | 2.62 |
|  | 80:20 | 5109 | 2.42 | 2.40 | 2.41 | 2.42 | 2.43 |

*dielectric constant

EXAMPLE 7

Measurement of Mechanical Properties of Resinous Film

Test pieces prepared as in the above Example 4 were analyzed for hardness and elastic modulus using Nanoindenter II(MTS Co.). The resinous film of each test piece was indented until the indentation depth reached 10% of its whole thickness, which had been previously measured by the use of a prism coupler. At this time, to secure the reliability of this measurement, 4 points were indented every test piece, and mean hardness and modulus were taken. The results are set forth in Table 6.

TABLE 6

| Resin | Resin soln.:Porogen soln. (v/v) | Thickness (Å) | Hardness (GPa) | Elastic modulus (GPa) |
|---|---|---|---|---|
| (A) | 100:0 | 10012 | 0.69 | 5.05 |
|  | 90:10 | 10002 | 0.69 | 4.46 |
|  | 80:20 | 9991 | 0.45 | 3.22 |
|  | 70:30 | 9340 | 0.38 | 2.40 |
| (D) | 100:0 | 5100 | 0.70 | 5.05 |
|  | 90:10 | 4920 | 0.59 | 4.32 |
|  | 80:20 | 4620 | 0.45 | 3.41 |
|  | 70:30 | 4374 | 0.40 | 2.50 |
| (G) | 100:0 | 5255 | 0.68 | 5.10 |
|  | 90:10 | 4800 | 0.60 | 4.61 |
|  | 70:30 | 4400 | 0.35 | 2.65 |

As described above, a resinous film made from the inventive siloxane-based resins has a low dielectric constant and excellent mechanical properties, which making it useful for an insulating film between interconnect layers of a semiconductor device.

The simple modification and change of the present invention will be readily made by any skilled person in the art and it should be understood that all of such modification and change are encompassed within the scope of the present invention.

What is claimed is:

1. A siloxane-based resin prepared by hydrolyzing and polycondensing monomers (a), (b) and (c) in an organic solvent in the presence of a catalyst and water, wherein monomer (a) is a cyclic siloxane compound of formula (1), monomer (b) is a silane compound of formula (2), and monomer (c) is a silane compound of formula (3):

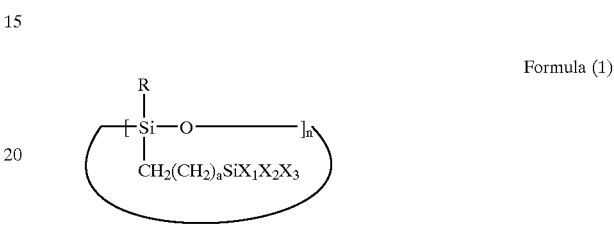

Formula (1)

[in which,

R is hydrogen atom, $C_{1-3}$ alkyl group, $C_{3-10}$ cycloalkyl group or $C_{6-15}$ aryl group;

each of $X_1$, $X_2$ and $X_3$, independently, is hydrogen atom, $C_{1-3}$ alkyl group, $C_{1-10}$ alkoxy group or halogen group, provided that at least one of them is $C_{1-10}$ alkoxy group or halogen group;

m is an integer from 1 to 10; and n is an integer from 3 to 8];

$$R'SiX_1X_2X_3 \qquad \text{Formula (2)}$$

[in which,

R' is hydrogen atom, $C_{1-3}$ alkyl group, $C_{3-10}$ cycloalkyl group or $C_{6-15}$ aryl group; and each of $X_1$, $X_2$ and $X_3$, independently, is $C_{1-10}$ alkoxy group or halogen group]; and $$R''SiX_1X_2X_3 \qquad \text{Formula (3)}$$

[in which,

R" is $C_{1-3}$ alkyl or aryl group including fluoro, phenyl or cyano substituent; and each of $X_1$, $X_2$ and $X_3$, independently, is $C_{1-10}$ alkoxy group or halogen group].

2. The siloxane-based resin according to claim 1, wherein the monomer(c) is selected from the group consisting of 3,3,3-trifluoropropyl trimethoxy silane, phenethyl trimethoxy silane and cyanoethyl trimethoxy silane.

3. A method of forming an insulating film between interconnect layers of a semiconductor device, the method comprising the steps of: dissolving a siloxane-based resin according to claim 1 in an organic solvent to provide a coating composition; coating a substrate with the coating composition to form a coating film; and curing the coating film by heat.

4. The method according to claim 3, wherein the coating composition further comprises one or more porogen(s).

5. The method according to claim 4, wherein the porogen is cyclodextrin of formula (4) or a derivative thereof:

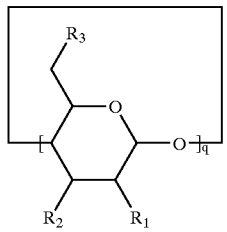

Formula (4)

[in which, q is an integer of 6–12;

each of $R_1$, $R_2$ and $R_3$, independently, is halogen atom, $C_{0-10}$ amino or azido group, $C_{3-20}$ imidazole or pyridine group, $C_{1-10}$ cyano group, $C_{2-10}$ carbonate group, $C_{1-10}$ carbamate group or a functional group represented by —$OR_4$ (wherein $R_4$ is hydrogen atom, $C_{2-30}$ acyl group, $C_{1-20}$ alkyl group, $C_{3-10}$ alkene group, $C_{3-20}$ alkyne group, $C_{7-20}$ tosyl group, $C_{1-10}$ mesyl group, $C_{0-10}$ phosphorus group, $C_{3-10}$ cycloalkyl group, $C_{6-30}$ aryl group, $C_{1-20}$ hydroxyalkyl group, carboxy group, $C_{1-20}$ carboxyalkyl group, glucosyl group, maltosyl group or Si compound represented by $Sir_1r_2r_3$, wherein each of $r_1$, $r_2$ and $r_3$, independently, is $C_{1-5}$ alkyl, $C_{1-5}$ alkoxy or $C_{6-20}$ aryl group)].

* * * * *